United States Patent [19]
Bertin et al.

[11] Patent Number: 5,807,791
[45] Date of Patent: Sep. 15, 1998

[54] METHODS FOR FABRICATING MULTICHIP SEMICONDUCTOR STRUCTURES WITH CONSOLIDATED CIRCUITRY AND PROGRAMMABLE ESD PROTECTION FOR INPUT/OUTPUT NODES

[75] Inventors: Claude Louis Bertin, South Burlington; Erik Leigh Hedberg, Essex Junction; James Marc Leas, South Burlington; Steven Howard Voldman, Burlington, all of Vt.

[73] Assignee: International Business Machines Corporation, Armonk, N.Y.

[21] Appl. No.: 785,032

[22] Filed: Jan. 2, 1997

Related U.S. Application Data

[60] Division of Ser. No. 532,451, Sep. 22, 1995, abandoned, which is a continuation-in-part of Ser. No. 392,461, Feb. 22, 1995, Pat. No. 5,703,747.

[51] Int. Cl.$^6$ ................................................ G11C 5/06
[52] U.S. Cl. ........................ 438/738; 437/51; 365/51; 257/777; 257/676; 257/203; 257/320; 257/723
[58] Field of Search .................... 257/777, 676, 257/672, 203, 320, 321, 322, 355, 356, 357, 358, 359, 360, 723; 438/738; 437/51; 365/51

[56] References Cited

U.S. PATENT DOCUMENTS

| | | | |
|---|---|---|---|
| 4,139,935 | 2/1979 | Bertin et al. | 29/571 |
| 4,198,696 | 4/1980 | Bertin et al. | 365/175 |
| 4,456,800 | 6/1984 | Holland | 200/5 A |
| 4,608,592 | 8/1986 | Miyamoto | 357/80 |

(List continued on next page.)

OTHER PUBLICATIONS

"Partitioning Function and Packaging of Integrated Circuits for Physical Security of Data", IBM Technical Buelletin, vol. 32 No. 1 (Jun. 1989).

"Chip–on–Chip DSP/SRAM Multichip Module" K. L. Tai et al., 1995 International Conf. on Multichip Modules (SPIE vol. 2575), pp. 466–471, (1995).

"Active Silicon Chip Carrier", D. J. Bodendorf et al., IBM Technical Disclosure Bulletin, vol. 15 No. 2, (Jul. 1972).

"A GaAs on Si PLL Frequency Synthesizer IC Using Chip on Chip Technology", S. Sekine et al., IEEE 1994 Custom Integrated Circuits Conference (Cat. No. 94CH3427–2), pp. 563–565, (1994).

*Primary Examiner*—Christopher L. Chin
*Assistant Examiner*—Bao-Thuy L. Nguyen
*Attorney, Agent, or Firm*—Heslin & Rothenberg, P.C.

[57] ABSTRACT

Multichip semiconductor structures with consolidated circuitry are disclosed, along with programmable electrostatic discharge (ESD) protection circuits for chip input/output (I/O) nodes. The multichip structures include a first semiconductor chip having a first circuit at least partially providing a first predetermined circuit function, and a second semiconductor chip electrically and mechanically coupled to the first semiconductor chip. The second semiconductor device chip has a second circuit that at least partially provides a circuit function to the first circuit of the first semiconductor chip. In one embodiment, the first semiconductor chip comprises a memory array chip, while the second semiconductor chip comprises a logic chip wherein at least some peripheral circuitry necessary for accessing the memory array of the memory array chip resides within the logic chip. This allows the removal of redundant circuitry from identical chips of a multichip structure. Also disclosed is removing, adding or balancing ESD circuit loading on input/output nodes of a multichip stack. Various techniques are presented for selective removal of ESD circuitry from commonly connected I/O nodes. Any circuitry interfacing with an external device may be rebalanced at the multichip level using this concept.

12 Claims, 10 Drawing Sheets

U.S. PATENT DOCUMENTS

| | | | |
|---|---|---|---|
| 4,677,520 | 6/1987 | Price | 361/220 |
| 4,727,410 | 2/1988 | Higgins, III | 357/74 |
| 4,734,752 | 3/1988 | Liu et al. . | |
| 4,894,706 | 1/1990 | Sato et al. | 357/72 |
| 4,937,471 | 6/1990 | Park et al. | 307/296.5 |
| 5,012,924 | 5/1991 | Murphy | 206/331 |
| 5,270,261 | 12/1993 | Bertin et al. | 437/209 |
| 5,424,896 | 6/1995 | Pasch et al. . | |
| 5,477,082 | 12/1995 | Buckley, III et al. | 257/679 |
| 5,502,667 | 3/1996 | Bertin et al. . | |
| 5,552,951 | 9/1996 | Pasch et al. . | |
| 5,561,622 | 10/1996 | Bertin et al. . | |
| 5,598,313 | 1/1997 | Gersbach . | |

METHODS FOR FABRICATING MULTICHIP SEMICONDUCTOR STRUCTURES WITH CONSOLIDATED CIRCUITRY AND PROGRAMMABLE ESD PROTECTION FOR INPUT/OUTPUT NODES

CROSS-REFERENCE TO RELATED APPLICATIONS

This application is a division of application Ser. No. 08/532,451 filed Sep. 22, 1995 which application is now: abandoned, which is a continuation-in-part of a commonly assigned U.S. patent application Ser. No. 392,461, filed Feb. 22, 1995 now U.S. Pat. No. 5,703,747, entitled "Multichip Semiconductor Structures With Interchip Electrostatic Discharge Protection, and Fabrication Methods Therefore."

TECHNICAL FIELD

This invention relates in general to fabrication of three-dimensional multichip structures, and more particularly, to consolidation of circuit functions within such structures, e.g., involving circuitry for protecting the integrated circuit chips from electrostatic discharges or other potentially damaging voltage transients occurring during the fabrication or subsequent handling and testing of a single chip, multiple chips or a three-dimensional multichip structure.

BACKGROUND ART

Semiconductor structures comprising three-dimensional arrays of chips have emerged as an important packaging approach. A typical three-dimensional electronic structure consists of multiple integrated circuit chips having main planar surfaces adhesively secured together to form a monolithic structure (referred to as a "stack" or "cube"). A metallization pattern is often provided directly on one or more edge surface of the multichip stack for interconnecting the chips and for electrical connection of the stack to external circuitry. This exposed metallization pattern can include both individual input/output (I/O) connects and bussed connects.

Electrostatic discharge (ESD) is a phenomenon known to degrade or destroy discrete electronic components. In particular, given the decreasing size of circuit features with ever improving process technology, static electricity can destroy or substantially harm many of today's integrated circuits. Triboelectric charges are produced anytime two surfaces are separated and if at least one of the surfaces is a nonconductor, then a static electric charge is produced. This is a natural phenomenon and only causes a problem if the static charge is allowed to discharge or induce a charge into the integrated circuit. Such an ESD event can occur very pervasively to a point of several thousand volts. The discharge occurs very rapidly and the usual failure or degradation is caused by the gasification of metal within the device resulting in the gasified metal becoming deposited along a trace of the discharge path.

The damage following each electrostatic discharge event may be instantly catastrophic. Often times, however, the integrated circuit does not totally fail, but rather, remains operable with a latent defect that will ultimately result in premature failure. Such events can also alter the operating characteristics of the integrated circuit, thereby resulting in unsatisfactory and often unpredictable operation. Electrostatic discharge between input/output connects of a semiconductor device chip can occur, for example, from human handling, automated circuit testing or during packaging of discrete integrated circuit chips.

It has now been discovered that during three-dimensional multichip fabrication, an ESD failure can occur chip-to-chip, for example, during side surface processing of the cube whenever a voltage potential is established between two adjacent chips. This can lead to arcing from the transfer metal pins of one chip to the substrate or transfer metal pins of the adjacent chip resulting in an electrostatic discharge event. An ESD event can also be generated during testing of a multichip semiconductor stack between the testing tool and stack metallization or an integrated circuit chip substrate within the structure, which can subsequently result in a chip-to-chip ESD event.

Most, if not all, known electrostatic discharge protection networks operate in connection with a single semiconductor device chip. Since electrostatic discharge suppression circuitry can comprise ninety (90%) percent of the load on an input/output node, there is a need in the art for optimization of such circuitry within a three-dimensional multichip structure. More generally stated, there exists a need in the multichip packaging art for an approach to optimizing performance of the three-dimensional structure by deleting or consolidating redundant circuitry. The concepts, circuits and methods presented herein address this need.

DISCLOSURE OF THE INVENTION

Briefly described, the invention comprises in a first aspect a multichip semiconductor structure which includes a first semiconductor device chip and a second semiconductor device chip electrically and mechanically coupled together. The first semiconductor device chip includes a first circuit at least partially providing a first predetermined circuit function, while the second semiconductor device chip has a second circuit that at least partially provides a circuit function to the first circuit of the first semiconductor device chip. As an extension of this concept, a multichip semiconductor structure comprising multiple memory array chips and a logic chip is provided. The multiple memory array chips have parallel main surfaces, and are stacked such that a planar main surface of each memory array chip is parallel and structurally coupled to a planar main surface of an adjacent memory array chip, thereby defining a multichip stack. The multichip stack includes a side surface and an end surface. The logic chip, which is disposed at the end surface of the stack and is electrically coupled to each memory array chip in the stack, includes a peripheral circuit function that is necessary for operation of each memory array chip of the multiple memory array chips such that without said peripheral circuit function, said memory array chips are nonfunctional.

In another aspect, the invention comprises a multichip structure having a first semiconductor device chip and a second semiconductor device chip. The first semiconductor device chip includes a first input/output (I/O) node and a first I/O circuit element, while the second semiconductor device chip includes a second I/O node The first I/O circuit element is designed to have an electrical connection to the first I/O node. A conductor electrically interconnects the first I/O node and the second I/O node, thereby defining a common I/O connection. The electrical connection between the first I/O circuit element and the first I/O node of the first semiconductor device chip is open circuited such that the first I/O circuit element is unconnected to the common I/O connection.

In a further aspect, the invention comprises a multichip structure including a first semiconductor device chip and a second semiconductor device chip. The first semiconductor device chip has a first input/output (I/O) node and a first I/O circuit element, while the second semiconductor device chip has a second I/O node. First means are provided for selectively electrically coupling the first I/O circuit element to the first I/O node. A conductor electrically interconnects the first I/O node and the second I/O node to define a common I/O connection. Thus, the first I/O circuit element of the first semiconductor device chip may be selectively electrically coupled to the common I/O connection.

In a still further aspect, a method is presented for fabricating a multichip semiconductor stack having input/output (I/O) nodes with electrostatic discharge protection. The method includes: providing a plurality of semiconductor device chips each having an integrated circuit connected to an I/O node and an electrostatic discharge suppression circuit with an electrical connection to the I/O node; laminating the plurality of integrated circuit chip such that a planar main surface of each semiconductor device chip is parallel and structurally coupled to a planar main surface of an adjacent semiconductor device chip, thereby defining a multichip stack having a side surface; establishing a conductive pattern on the side surface of the multichip stack, the conductive pattern electrically connecting to each of the I/O nodes from the plurality of semiconductor device chips, at least some of the I/O nodes being electrically connected at a common I/O node; and open circuiting the electrical connection between the electrostatic discharge suppression circuits and the respective I/O node of at least one semiconductor device chip connected to the common I/O nodes, thereby customizing the electrostatic discharge protection coupled to the common I/O node.

To summarize, disclosed herein are semiconductor structures with numerous novel features and advantages over the existing art. First, through selective consolidation of redundant circuitry of a plurality of substantially identical chips into a single chip in a multichip stack, overall stack performance is improved since signal delay through redundant networks is eliminated. For example, output data from a dynamic random access memory (DRAM) chip in a DRAM stack must travel through two sets of off-chip drivers, one set on the DRAM chip itself, and another set on a logic endcap in communication with external stack circuitry. Elimination of the redundant off-chip driver can improve performance by as much as 2 nanoseconds. Further, unlike a conventional DRAM chip, operational functions and memory array configurations defined at a separate logic chip can be readily converted to any specific application requirement by either redesigning the logic chip or replacing the logic chip with another design. Each memory array chip may principally comprise a memory array, array decoders, bit switches and sense amplifiers, which greatly enhances array utilization. With such complexity reduction, manufacturing and testing can also be simplified. Thus, universal three-dimensional memory array stacks can be created with synchronous operation, input/output width, power rating, power supply, signal levels and other applications specific features defined at an interchangeable logic chip.

Another feature of the invention is the reduction or balancing of loading of I/O pads of a multichip structure. Since electrostatic discharge suppression circuitry can comprise up to ninety (90%) percent of capacitive loading on I/O pads, this concept centers on the elimination or redistribution of ESD circuitry within a multichip structure. However, any circuitry interfacing with an external device could be rebalanced at the multichip package level. The concept applies to bussed I/O pads, as well to single I/O pads. In application, only one ESD circuit may be required to protect all receivers electrically connected by a bussed I/O pad. This single circuit could be disposed in any of the interconnected chips or on a separate chip which interacts with external circuitry, for example, an endcap chip. Further, any number of techniques may be employed for open circuiting redundant electrostatic discharge circuitry.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 1b is a perspective view of a multichip semiconductor structure incorporating a plurality of memory array chips of FIG. 1a;

FIG. 2b is a schematic of a multichip semiconductor structure incorporating a plurality of memory array chips of FIG. 2a;

BEST MODE FOR CARRYING OUT THE INVENTION

Generally stated, as a first concept the present invention comprises the identification and removal of redundant peripheral circuitry from identical integrated circuit chips of a multichip structure. (As used herein, the phrase "multichip structure" generally refers to multichip "stacks" or "cubes", as well as to conventional multichip modules (MCMs), i.e., if not otherwise specified.) By way of example, peripheral circuitry on dynamic random access memory (DRAM) chips is needed to read, write and refresh the memory cells, as well as to provide industry standard or custom operation, off-chip driving and package adaptability. Array utilization is referred to in the art as the measurement of memory array area to total chip area which includes the peripheral circuitry area. Stacking of standard DRAM chips to create a multichip semiconductor stack results in redundancy of many peripheral functions and circuitry. Reducing this redundancy is proposed herein in order to increase array utilization within the memory chips.

More particularly, by moving peripheral (also referred to as input/output (I/O)) circuitry functions from the memory chips to a separate logic chip in the multichip semiconductor structure, the peripheral circuits can be eliminated from the individual memory chips. Examples of such I/O function circuitry would include circuits for the row address strobe/column address strobe (RAS/CAS) function, the memory read/write controls, refresh controls, off-chip drivers, protect devices and bonding pads. As set forth above, consolidating this circuitry for all memory chips in a single logic chip can significantly enhance performance of the resultant structure.

Another concept presented herein is the selective removal, addition or balancing of electrostatic discharge (ESD) circuit loading on external input/output (I/O) nodes or pads of a multichip semiconductor stack. The selective removal of ESD circuitry from a particular input/output node within a single integrated circuit chip is also contemplated. As one example, it may be desirable to reduce loading on one or more pins of a packaged integrated circuit chip. Removal of the ESD circuitry from a pin is significant since ESD circuitry can comprise up to ninety (90%) percent of the capacitive load on a pin. This concept of unloading/loading external I/O nodes applies to a single chip, and to any multichip structure, including stacks, MCMs, cards and boards. Further, essentially any circuitry interfacing with an external device may be rebalanced at the multichip package level using this concept.

Figure 1A:
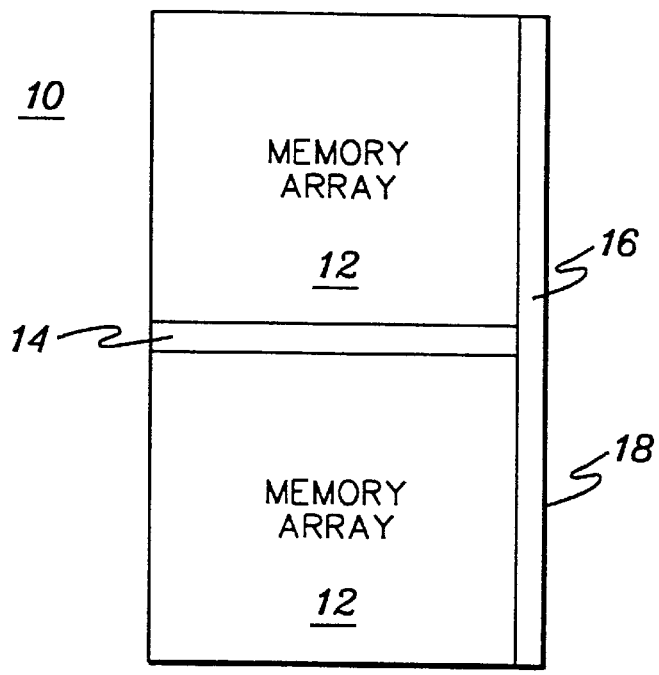
FIG. 1a is a plan view of one embodiment of a memory array chip for use in a multichip semiconductor structure in accordance with the present invention.
Figure 1B:
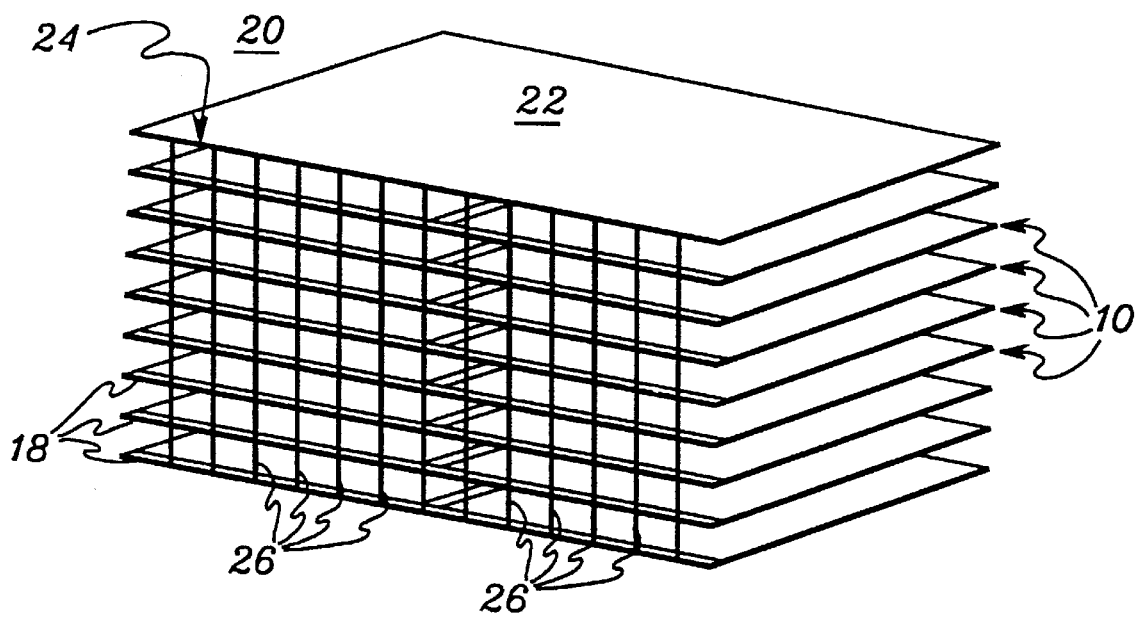

The structures and methods in accordance with the present invention are described in greater detail below with reference to FIGS. 1a–14, wherein the same or similar reference characters are used throughout multiple figures to designated the same or similar components. In FIG. 1a, a memory array chip 10 is shown to comprise a memory array 12 wherein word decoders 14 split the array for center-tapped wordlines. Along one edge 18 of chip 10 are disposed bit switches, sense amplifiers and drivers 16 for the memory array. Circuitry 14 & 16 is referred to herein as the "memory access circuitry." Note from this figure that the conventional peripheral (or input/output) circuit functions, such as the RAS/CAS functions, memory read/write controls, refresh controls, off-chip drivers and protect devices, are assumed to have been transferred to a second semiconductor chip to be packaged with memory chip 10 within a multichip semiconductor structure (FIG. 1b). Chip 10 is thus configured for maximum memory array 12 density.

FIG. 1b depicts a multichip semiconductor stack 20 comprising a plurality of memory array chips 10 having aligned edge surfaces 18. An endcap chip 22 is disposed at one end of stack 20 and conductive patterning 26 is provided on at least one side surface 24 of the multichip semiconductor stack to electrically connect the memory chips of the stack to the endcap chip 22. Chip 22 may comprise a logic chip containing (in one embodiment) all input/output (I/O) circuit functions for the memory chips 10 in the stack. Disposition of the bit switches, sense amps and drivers along edge surface 18 of each memory chip results in a beneficial layout from a performance standpoint in that transmission distances are reduced. Alternatively, these structures could be disposed in the middle of the memory arrays (FIG. 2a) and then brought out to edge surface 18 via conventional transfer wirings. As a variation, note that the peripheral circuit functions removed to the endcap chip could be disposed on a logic chip located anywhere within the stack.

Operationally, complementary metal oxide semiconductor (CMOS) level signals are driven down the stack 20 from the logic endcap chip 22 to the word decoders of the individual memory chips, where the signals are latched via a word enable buffer. After sense amplifiers have set, the bit switches along the chip edges are opened in response to the incoming bit address. Data is driven back up the stack to the logic endcap chip 22, and hence off stack to external circuitry. This structure has many advantages over pre-existing stack technology. For instance, memory array I/O connections occur directly along the edge of each memory chip proximal to the side face wiring of the stack, thus eliminating the need for long, slow transfer wirings over a memory array. Also, since the I/O requirements are removed to the logic chip, the number of side surface wiring signals is reduced, which relieves the lithography constraints required to bring all the I/O functions out from a standard DRAM chip, or permits increased data transfer between the chips.

Figure 2A:
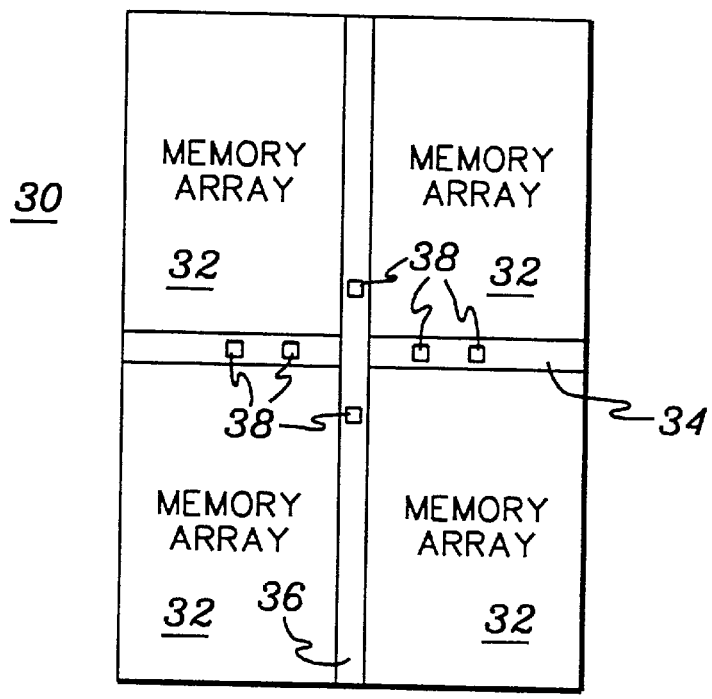
FIG. 2a is an alternate embodiment of a memory array chip for use in a multichip semiconductor structure in accordance with the present invention.
Figure 2B:
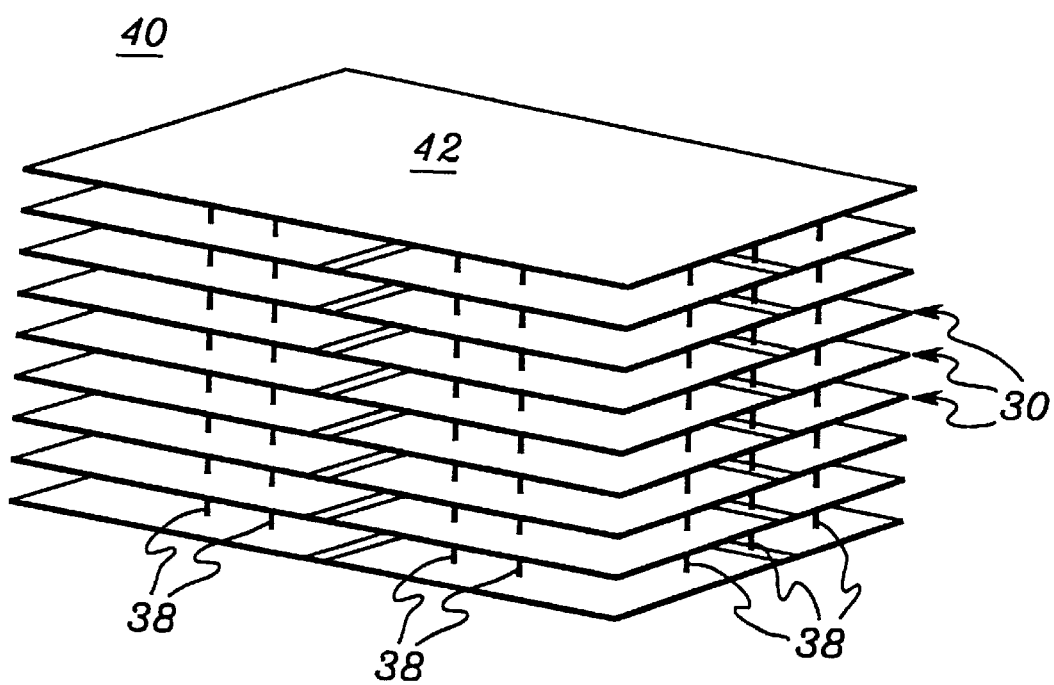

FIG. 2a depicts an alternate layout for the memory access circuitry within a memory array 32 of a memory chip 30. In this implementation the word decoders 34 again split the array for center-tapped wordlines, while the bit switches, sense amplifiers and drivers 36 are disposed transverse the word decoders 34 at the center of the array. Wireout from the array can either be by transfer wirings to one or more edge surface of the chip or, as shown in FIGS. 2a & 2b, via metallized vias or trenches through the chip. One approach to creating such metallized trenches is presented in commonly assigned U.S. Pat. No. 5,270,261, entitled "Three-Dimensional Multichip Package Methods of Fabrication," which is hereby incorporated herein by reference. A resultant multichip semiconductor stack 40 is shown in FIG. 2b wherein metal filled trenches 38 electrically interconnect the plurality of memory chips 30 and an endcap chip 42. By driving and sensing the memory arrays through metallized trenches 38 that land proximal to the access circuits, significant distance to the logic endcap can be eliminated, thereby improving performance of the resultant structure. As a variation, note that the peripheral circuit functions removed to the endcap chip could be disposed on a logic chip disposed at any location within the stack.

The array example employed above focuses on DRAM-type memory array chips with RAS/CAS timing circuits, refresh control circuits etc., on a separate chip. Other memories, such as static random access memories (SRAMs) can implement pipeline operations on a separate chip. Electrically erasable programmable read-only memories (EEPROMs) can implement a common programming control and verification circuit function on a separate chip for controlling several arrays. Further, structured logic functions such as programmable logic arrays (PLAs), lend themselves to separation of AND/OR array functions on one chip and input, output, bit partitioning and feedback circuitry on another chip. Microprocessor logic functions can also be optimized around a core arithmetic logic unit (ALU), register file/execution unit and microcode on one chip with local cache (L1), instruction queue/decode, bus unit, etc., on another chip.

Figure 2C:
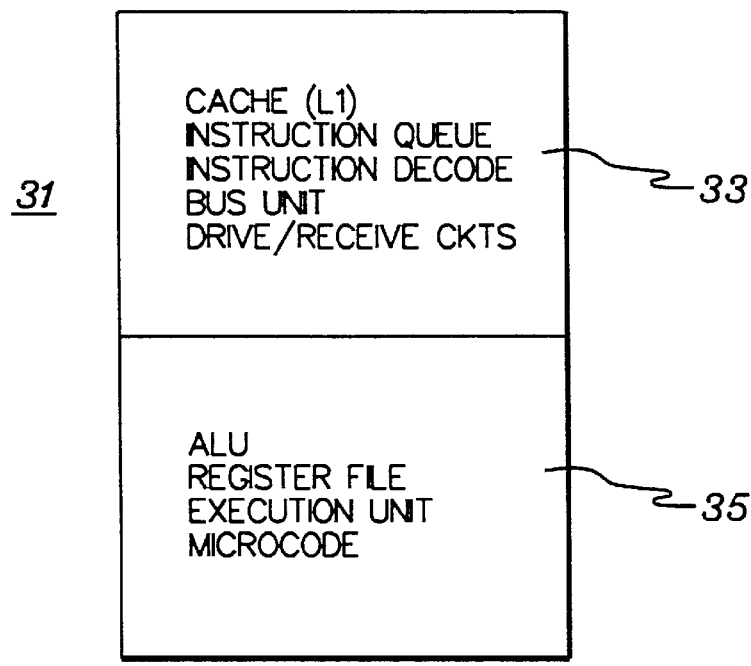
FIG. 2c is a block diagram of typical microprocessor chip functions.
Figure 2D:
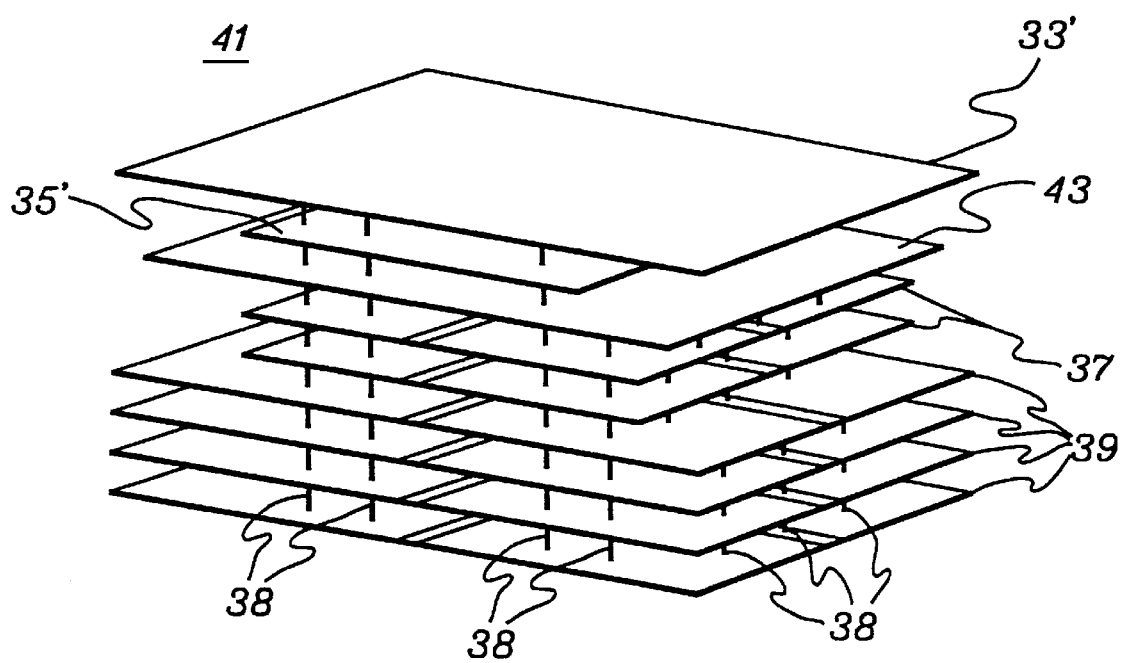
FIG. 2d is a partial perspective view of a multichip semiconductor structure comprising memory array chips, microprocessor function chips and application specific integrated circuit (ASIC) chips.

As a further variation, a semiconductor stack having metal filled trenches interconnecting the chips can accommodate integrated circuit chips of various sizes and facilitate various combinations of memory arrays and core microprocessor logic elements, along with application specific integrated circuit (ASIC) chips containing circuits typically found on the same chips as the memory array and core logic functions. For example, FIG. 2c depicts elements of a microprocessor function, separated into two parts. A detailed discussion of this microprocessor function is provided in a textbook by H. B. Bakoglu, entitled *Circuits, Interconnections and Packaging for VLSI*, Addison-Wesley Publishing Company, pp. 145–146 (1990). FIG. 2d depicts a metal filled trench stack, generally denoted 41, consisting of core logic, memory and ASIC chips interconnected as an integrated computer system.

As noted, FIG. 2c shows a microprocessor chip 31 with functions partitioned into two parts. A first part 33 contains a local cache (L1), instruction decode function, bus interface function, etc., while a second part 35 contains the microprocessor ALU, register, execution and microcode functions. In FIG. 2d, the microprocessor function of part 35 is optimized as an integrated microprocessor chip 35', while the remaining microprocessor function is optimized as a chip 33' containing a bus interface function integrated with other logic to form an external interface endcap chip (33'). The microprocessor chip 31 function, implemented as these two separate chips 33' and 35', can be readily integrated into stack 41 with filled metal vias. For example, SRAM cache arrays 37 provide secondary cache (L2) for the microprocessor. DRAM arrays 39 are used for microprocessor memory storage, while an ASIC chip 43 contains the memory controller function, SRAM pipeline circuits to increase the SRAM data rate, DRAM timing and refresh, and I/O circuits for both SRAM and DRAM arrays. Sheets of thermally conductive material (not shown) with openings to accommodate trench filled via interconnections may be incorporated into the stack to facilitate thermal management of the stack. Wiring of different sized chips is also possible with side face wiring on one or more co-planar side surfaces of the multichip stack, or the logic and array stack can be wired employing a combination of side surface and trench filled via connections.

Figure 3:
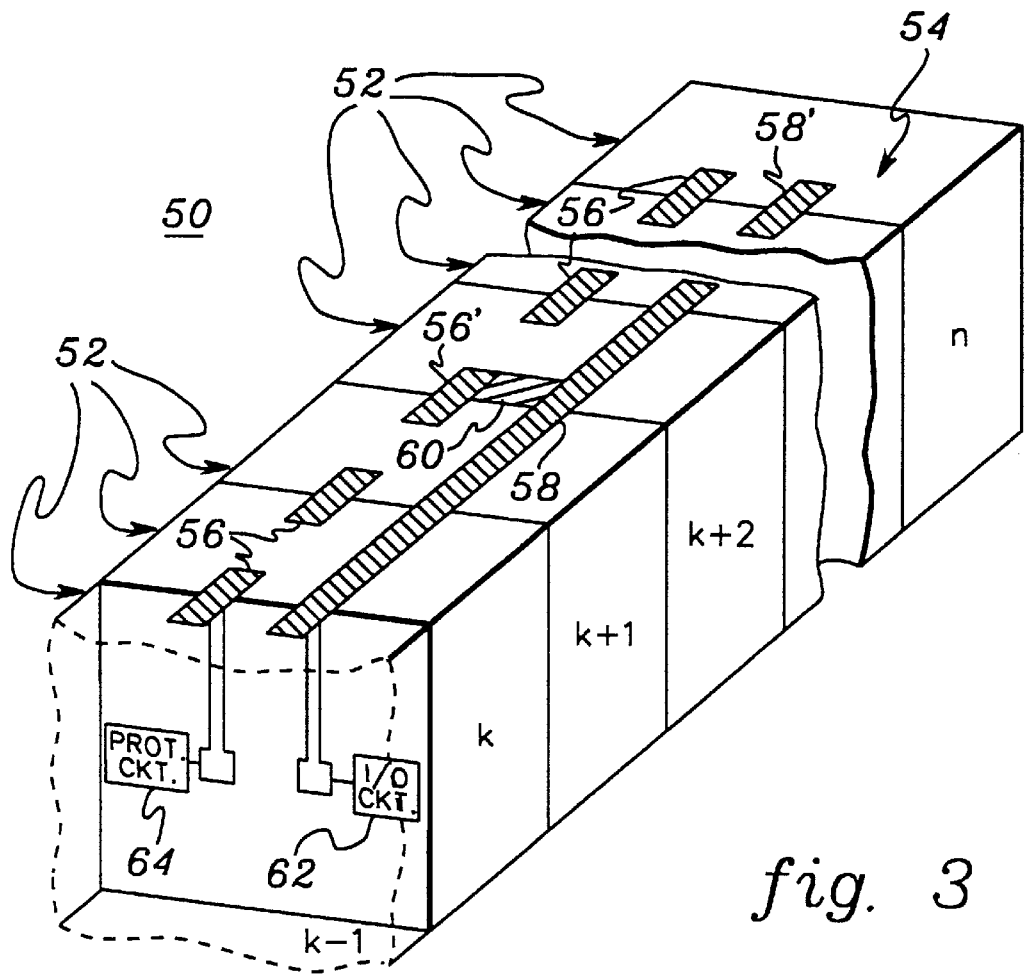
FIG. 3 is a partial perspective view of a multichip semiconductor structure selectively employing protection circuitry in accordance with the present invention.

FIG. 3 depicts another example of the concept of eliminating redundant circuit elements from a multichip semiconductor stack. A significant application of eliminating redundancy concerns electrostatic discharge protection circuitry. In many applications, only one ESD device may be required to protect all receivers placed in parallel within a multichip stack. This single ESD circuit can be placed in any of the memory chips or in a separate chip (e.g., an endcap chip) which interacts with external circuitry. If n identical memory chips are contained within a multichip stack, each of which has an ESD protect circuit connected to a common I/O node, then the common node may have an unnecessarily high level of ESD protection. This is because the capacitive loading and leakage at the node will be n× higher.

In general, in any case where an undesirable number of parallel elements are present at a given I/O node as a result of integration of identical chips into a multichip structure, this invention presents mechanisms for customizing the multichip structure to meet a desired leakage, capacitance, impedance and/or functional objective. Customization can be achieved by isolating undesired redundant elements using, for example, fuses, anti-fuses, wiring personalization, etching techniques, focused ion beam (FIB) personalization or active circuitry control. In fact, any standard technique employed in the semiconductor field for isolation of an integrated circuit can be used.

One approach to eliminating redundant ESD protection circuitry is depicted in FIG. 3, wherein a multichip stack 50 is shown to comprise a plurality of integrated circuit chips 52 arranged such that a planar main surface of each chip 52 is laminated to a planar main surface of an adjacent chip in the stack. A side surface 54 of stack 50 contains conductive patterning including single chip I/O pads 56, 56' & 58' and bussed or common I/O pad 58. By way of example, chip k+1 is shown to contain conductive wiring 60 interconnecting the common I/O node 58 to that chip's particular protect circuit node 56'. Each pad 56 is assumed to be electrically connected to a protection circuit 64 disposed within the respective chip 52. Similarly, wirings 58 & 58' are electrically connected in a respective chip's input/output integrated circuit 62. Thus, to provide electrostatic discharge protection to the common I/O connection 58, there must be electrical connection of that node to one or more of the protect circuits 64, such as disposed within chips k−1, k, k+1 and k+2.

Figure 4:
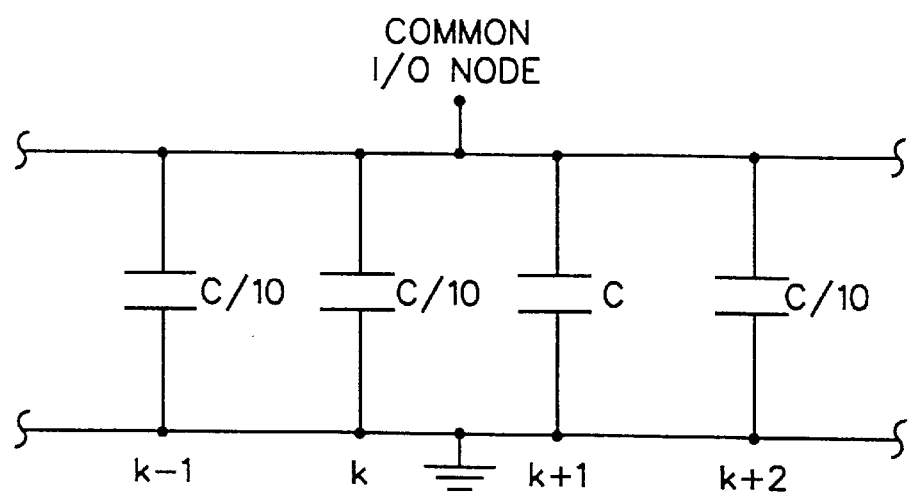
FIG. 4 is a schematic of the capacitive loading on the common input/output (I/O) node interconnecting chips k–1 to k+2 of FIG. 3.

As shown by the equivalent circuit of FIG. 4, connection of the common I/O node to a single protect circuit rather than four protect circuits reduces capacitive loading significantly. For example, if capacitive loading on the common I/O node from the I/O circuitry of each chip k−1, k, k+1 and k+2 is assumed to comprise C/10, then the capacitive loading with only one protect circuit connected to the common I/O node 58 (FIG. 3) might be 1.3C. In contrast, if each I/O circuit is electrically connected to the corresponding protect circuits of chips k−1, k, k+1, and k+2, then the loading on the common bus 58 would be 4C, which is a significant difference.

Figure 5:
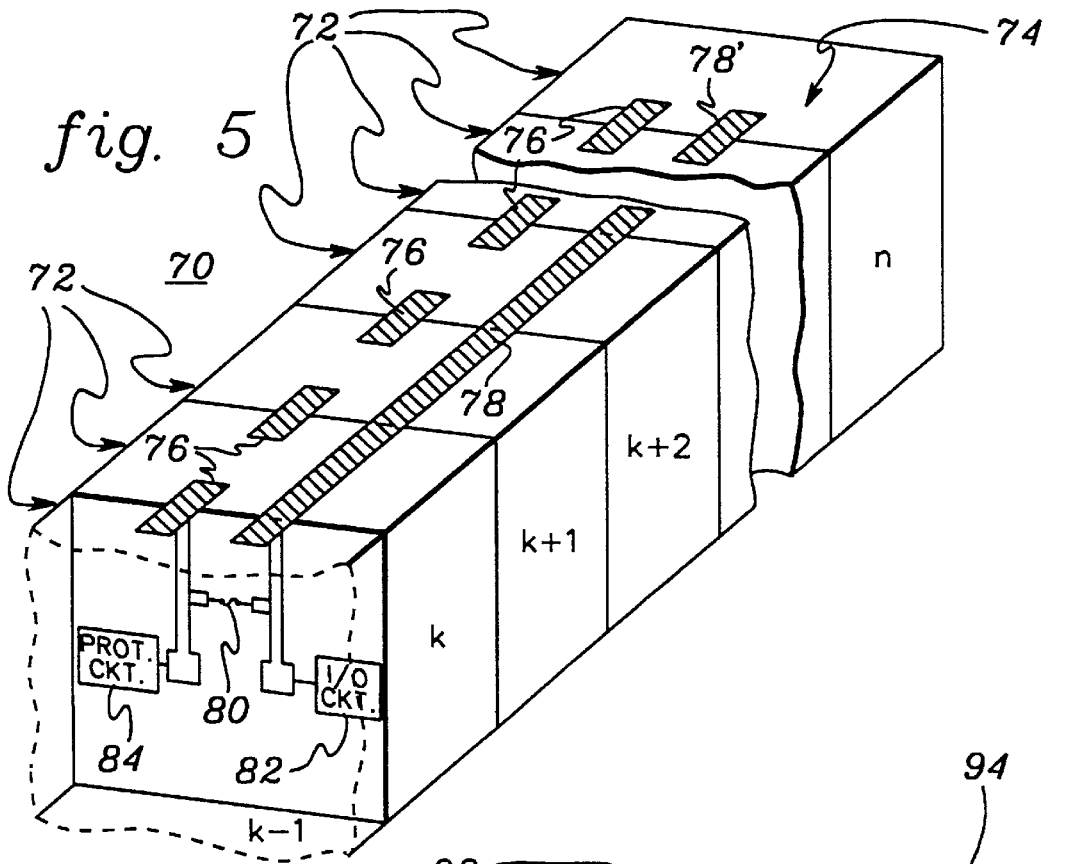
FIG. 5 is a partial perspective view of a multichip semiconductor structure employing electrically "removable" protect circuitry in accordance with the present invention.

FIG. 5 depicts another approach to eliminating redundant ESD networks. As shown, a multichip semiconductor stack 70, comprising a plurality of integrated circuit chips 72, has conductive patterning 76, 78 and 78' on one side surface 74 thereof. Each pad 76 electrically connects to a corresponding protect circuit 84 of an associated chip 72, while I/O patterning 78 & 78' electrically connect to at least one corresponding I/O circuit 82 of chips 72. Each chip 72 contains an electrical fuse 80 interconnecting its respective protect circuit 84 and I/O circuit 82 to be protected from an ESD event. Those skilled in the art will note that by the application of an appropriate potential between its pads 76 and 78 (or 78') of one of the chips, the connection between the protect circuitry 84 and the I/O circuit 82 can be open circuited. Thus, the amount of ESD protection applied to the I/O circuit nodes 78 and 78' on side surface 74 may be electrically programmed.

This is significant for common I/O nodes since redundant protective circuitry 84 from one or more of the chips electrically connected to the node may thus be readily "removed" from the node. Further, note that even though the I/O circuit connections are bussed 78, individual fuses 80 on the chips may still be open circuited as long as the I/O pads to the respective protect circuits remain electrically separate. The result is a subtractive removal of ESD protection circuitry from either a single chip I/O pad 78' or a common I/O pad 78. This approach has the advantage that the protect circuitry is connected to the I/O pads while individual chips are being handled and assembled within the multichip stack, without unduly loading the I/O nodes of the resultant stack. That is, by subsequently forcing an appropriate current between the pads 76 and 78 of one or more of the chips, the fuse may be opened. As another variation, this concept may be employed in a single chip environment to protect a chip during fabrication handling, but once packaged, used to electrically remove unneeded ESD protection at a higher level of assembly.

Figure 6:
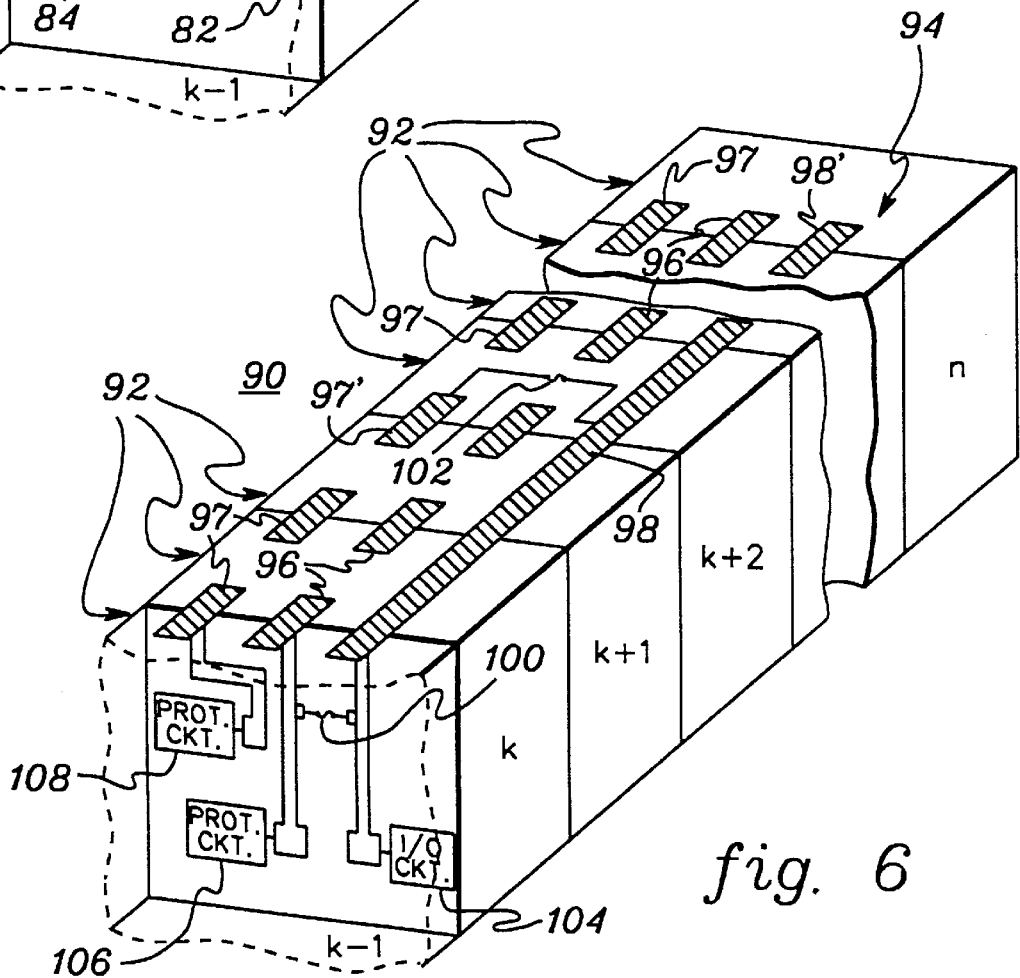
FIG. 6 is a partial perspective view of an alternate embodiment of a multichip semiconductor structure employing electrically removable protect circuitry pursuant to the present invention.

Still another approach to elimination of redundant ESD circuitry is presented in FIG. 6, wherein a multichip stack 90 comprises a plurality of chips 92 laminated together. A side surface 94 of stack 90 includes a conductive pattern of pads 96, 97, 97', 98 & 98'. Each pad 96 electrically connects, via transfer wiring, to an ESD protect circuit 106, each of which is fuse 100 connected to a corresponding I/O circuit 104. A plurality of I/O circuits 104 couple to a bussed I/O node 98. In this embodiment, a supplemental ESD protection circuit 108 is also present on at least some chips 92 in the stack. This protection circuitry is brought out to a pad 97 on side surface 94 via appropriate transfer wiring. A conductor electrically interconnects one such pad 97' to the common I/O bus 98 via a fuse 102. The amount of ESD protection provided by circuit 108 may be the same or different from that provided by circuit 106.

Note that with this approach, ESD protection may be added to an I/O node of an I/O circuit 104 subsequent to assembly of the multichip stack through appropriate side surface wiring. This enhances flexibility for optimizing or balancing ESD protection on the I/O pads of the multichip stack, which is significant since the protection rating of a multichip structure comprises the least protection provided on any I/O pad. Thus, by being able to delete or add ESD protection at the stack level, the loading on the I/O pads of the stack may be balanced to achieve an overall increased ESD rating for the multichip structure.

Figure 7A:
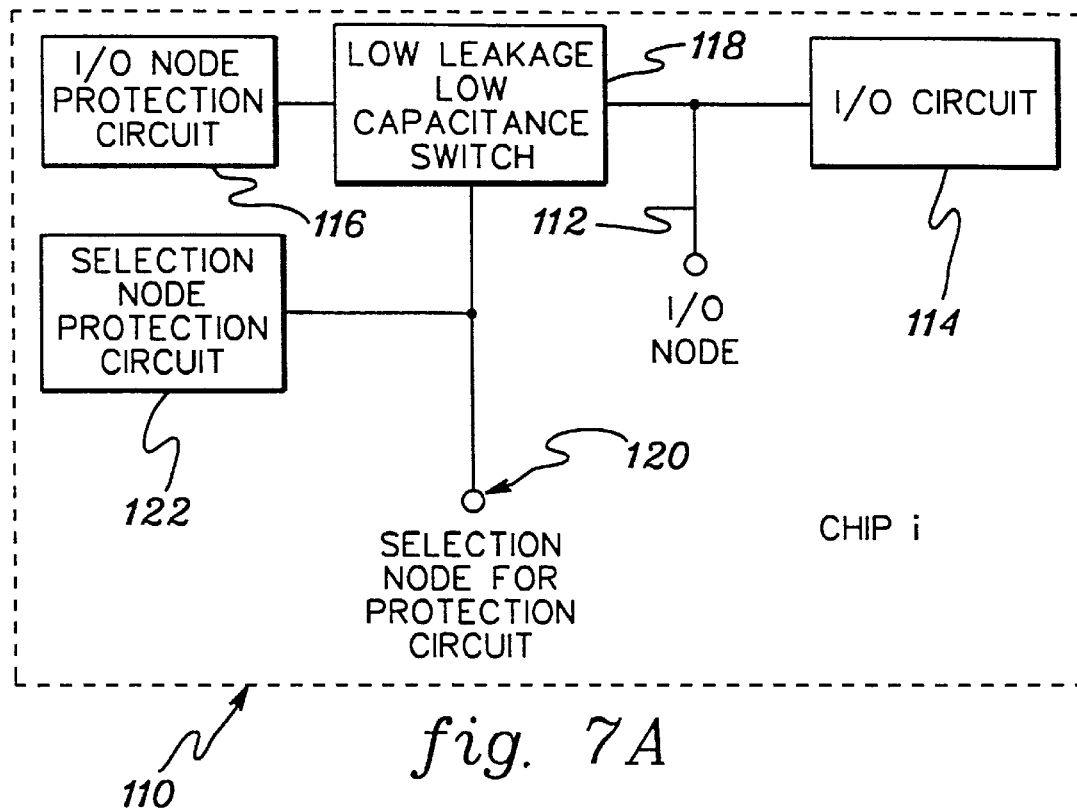
FIG. 7a is a schematic of an integrated circuit chip having selectable I/O protection circuitry employing a switch controllable via a protect deselect node.
Figure 7B:
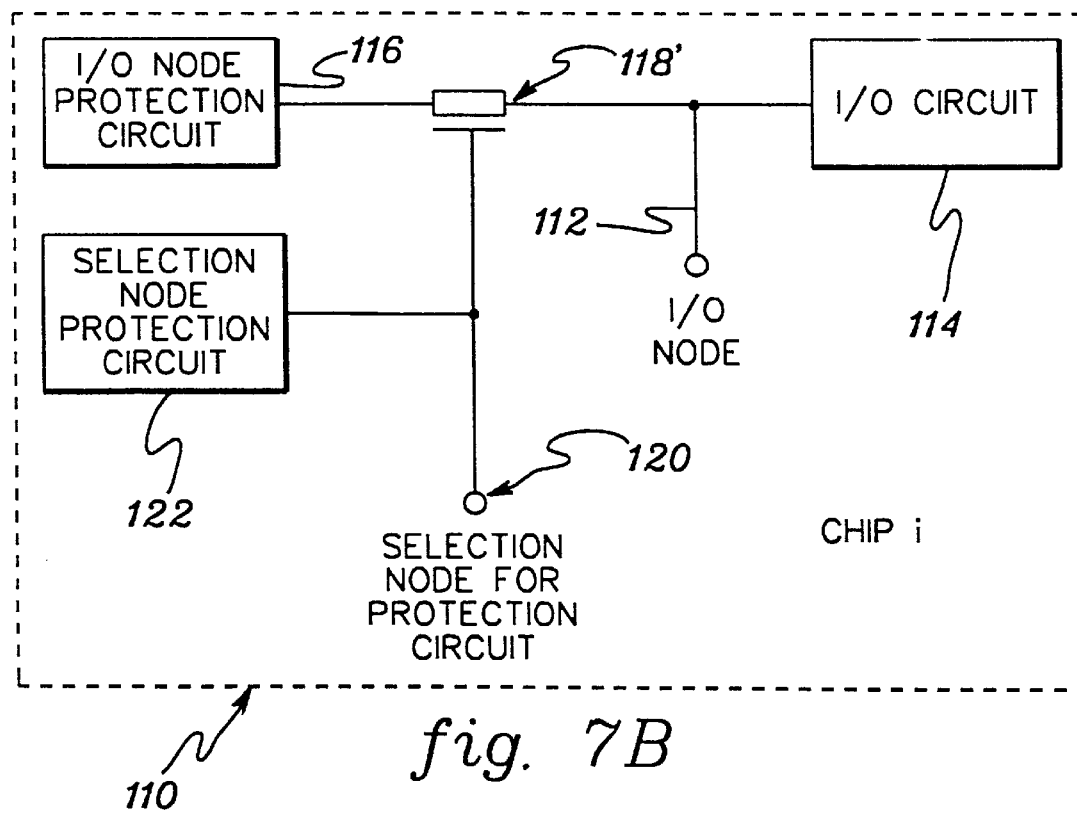
FIG. 7b is a schematic of an integrated circuit chip having selectable I/O protection circuitry employing a pass gate switch controllable via a protect deselect node.
Figure 8:
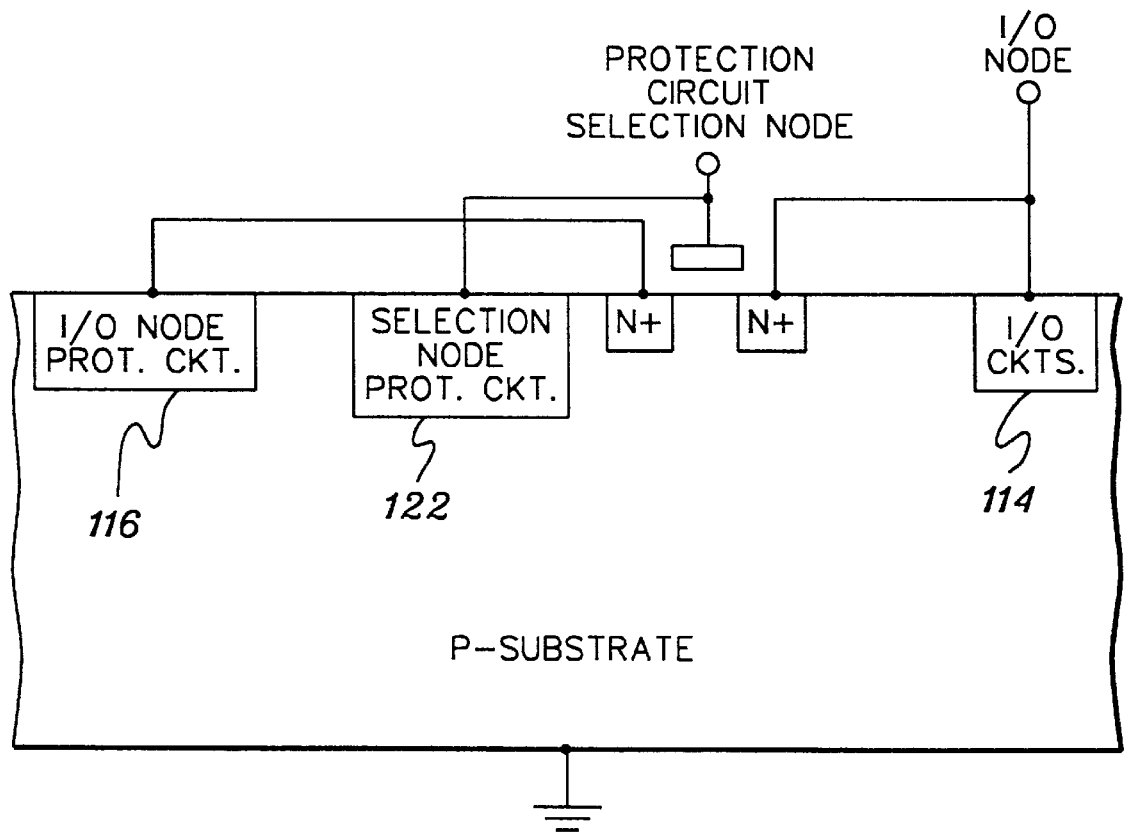
FIG. 8 is a partial structural, partial circuit diagram for one embodiment of the integrated circuit chip of FIG. 7b.

Another approach to selective ESD protection is presented in FIGS. 7a, 7b & 8. The concept underlining this structure/circuit is that for an integrated circuit chip i 110 having an I/O node 112 connected to an I/O circuit 114, electrostatic discharge protection 116 is normally active for protection of circuit 114 against an electrostatic discharge event occurring during fabrication and handling of the chip. Subsequently, once the chip has been installed into a final package or system, a switch 118 (FIG. 7a), is opened to isolate protect circuit 116 from loading I/O node 112. By choosing a switch of low capacitive loading and low leakage current, the resultant chip can operate faster and at lower power dissipation. The protect circuit could be activated externally via the application of an appropriate signal to a selection node 120 electrically connected to the control gate of pass gate 118. This node 120 preferably has its own protect circuit 122 for protection against an electrostatic discharge event at the node. As an alternative to the circuit presented, the switch could be activated internal to the chip (or multichip structure) using circuits activated by test or configuration patterns applied to the other pads. In one embodiment, the switch can be a pass gate 118' as shown in FIG. 7b.

One partial structural depiction of the circuitry of FIG. 7b is presented in FIG. 8. As shown, pass gate 118' may comprise an N channel device formed by N+ diffusions in a P substrate. The selection node protect circuit 122 and the I/O node protection circuit 116 are disposed in the P substrate. During handling, the ESD signal polarity applied to the I/O node may be positive or negative relative to the P-substrate material. If negative, then the NMOS transfer device behaves like a lateral NPN transistor. Specifically, as the diffusion tied to the I/O node goes negative, the N+ diffusion behaves like the emitter of the lateral NPN transistor. The P substrate functions as the base, and the collector function is supplied by the N+ diffusion tied to the I/O node protect circuit 116. If a positive ESD event occurs at the I/O node, then the N+ diffusion tied thereto goes positive. The device couples voltage to the gate of the NMOS device which completes the channel of the NMOS field-effect transistor to the N+ diffusion tied to the I/O node protect circuit 116, thereby completing the circuit to the protection device.

When the circuit or multichip structure is finally assembled, the switch or transfer gate at selection node 120 (FIG. 7a & 7b) is turned off, thereby resulting in the I/O circuit being only lightly loaded, thus producing a higher performance and lower power leakage. Bare integrated circuit chips, chips in single or multichip structures, packaged or unpackaged on cards and boards, etc. are all examples of electronic assembles which can benefit from the ability to electronically control the connection of protect devices to I/O nodes of an I/O circuit. As an alternative, the switch or transfer gate may be de-activated electronically on chip in final packaged form without using selection node 120.

Figure 9:
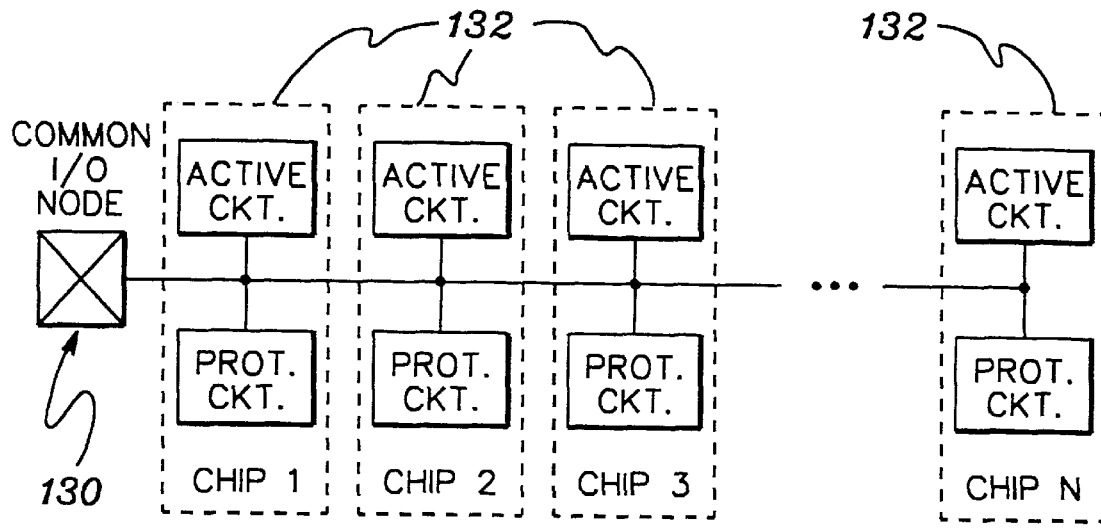
FIG. 9 is a schematic of a common I/O node of a multichip semiconductor structure having n chips electrically connected thereto, each chip with a separate protect circuit.
Figure 10:
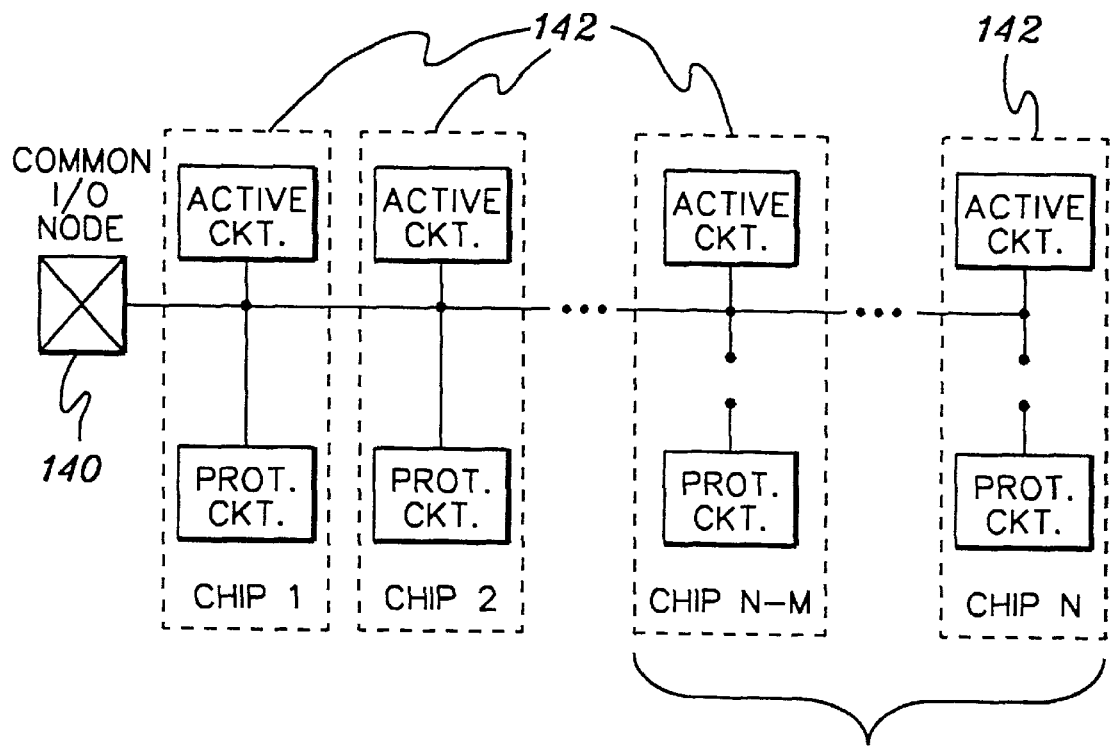
FIG. 10 is a schematic of a common I/O node of a multichip semiconductor structure having n chips electrically connected thereto, wherein m chips have open circuited connections to the protect circuits such that the circuits are isolated from the common I/O node.

FIGS. 9–12 are presented by way of overview. In FIG. 9, a common I/O node 130 of a multichip structure, such as a multichip stack or multichip module (MCM), electrically interconnects N chips 132, each of which has an active circuit and a protect circuit tied to the node. The protection circuit is assumed to comprise an ESD type protection circuit, which as noted above, can result in significant capacitive loading on a common I/O node 130. In addition to increasing capacitive loading, the extra of ESD protection, i.e., N protection circuits, may simply be unnecessary. Thus, pursuant to the invention and as shown in FIG. 10, a common I/O node 140 connects to a plurality of integrated circuit chips 142 each of which has an active circuit tied to the node 140, and only some of which have protective circuits tied to the node. In this example, protect circuitry from M integrated circuit chips has been removed from node 140 by open circuiting the electrical connection between the respective protect circuits and the node. The number of protect circuits to be removed in any given implementation can be experimentally determined by one skilled in the art. For example, if a protect circuit provides an ESD suppression protection of approximately 4,000 volts and 10 of these devices are tied to a common I/O pin, an ESD protection level of approximately 40,000 volts exists. Such a protection level may be excessive. Assuming that a 16,000 volt ESD protection rating is desired, then 4 of the protect circuits of the 10 chips may be electrically connected to the common I/O node, with the remaining 6 protect circuits open circuited from the node.

Figure 11:
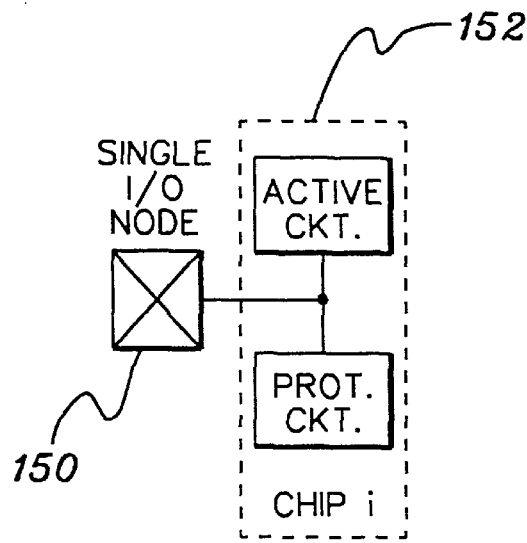
FIG. 11 is a schematic of an I/O node having a single integrated circuit chip electrically connected thereto.

As shown in FIG. 11 certain I/O pads on multichip structures may comprise an I/O node 150 tied to a single integrated circuit chip i 152. If an assumption is made that the protect circuit in chip i is substantially identical to the protect circuit in the N chips of FIGS. 9 & 10, then the ESD protection rating for node 150 would be approximately 4,000 volts. As noted above, the ESD suppression rating of a multichip structure comprises the ESD protection rating level of the least protected node in the structure. Thus, a multichip structure which has 16,000 volts ESD suppression protection on all I/O pads except for one I/O node 150 will still be rated as a 4,000 volt structure. Thus, the concept introduced herein is to rebalance the protection circuitry loading such that the single chip I/O node 150 in the multichip structure will contain a level of ESD protection desired for the entire multichip structure.

Figure 12:
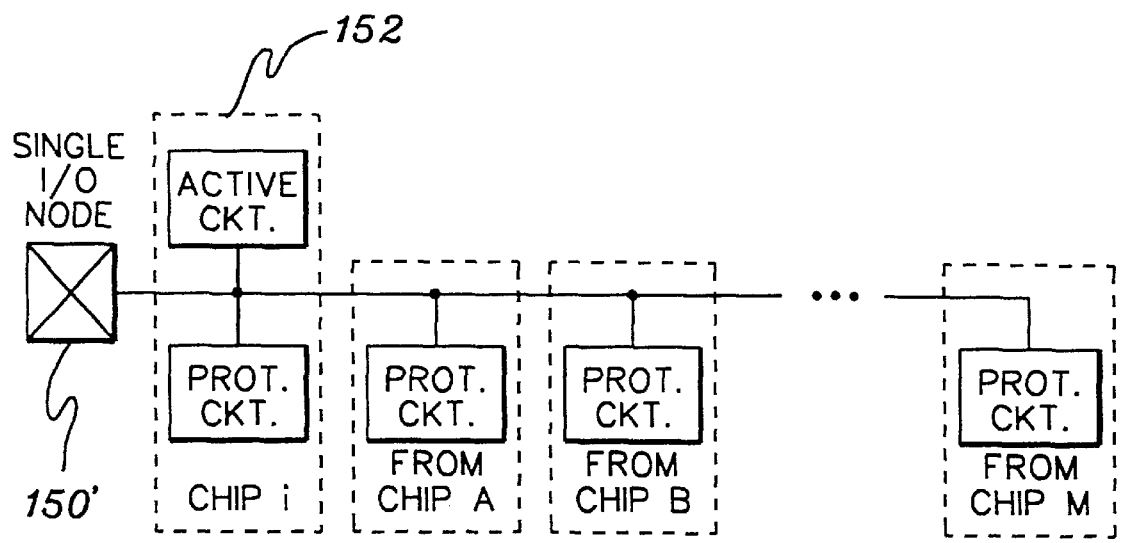
FIG. 12 is a schematic of the single chip I/O node of FIG. 11, wherein multiple protect circuits, for example from other chips in a multichip structure, are electrically connected to the node to enhance protection at said node.

As shown in FIG. 12, this can be accomplished by connecting a plurality of protect circuits from, for example, other integrated circuit chips in the stack (chip A, chip B, . . . chip M), to the single chip 152 I/O node 150'. Through a redistribution of the protection circuits within a multichip stack, better loading and electrostatic discharge robustness are attained. Note that this concept of "balancing" between I/O nodes or pins of a multichip structure is not limited to just electrostatic discharge protection circuitry. For example, decoupling capacitors, lead transistors, and possibly drivers may all comprise I/O circuit elements for which loading may be balanced within the multichip structure. In general, any I/O circuitry can be balanced in this manner.

Further, note that the protect circuitry need not come from separate integrated circuit chips in the structure, but rather the added circuitry may reside on a single chip, such as a logic endcap chip that is present for the purpose of supplementing the on-chip protection circuitry of the integrated circuit chips in the multichip structure. The addition or removal of circuitry from loading a particular I/O node can be accomplished as described above, for example, by wiring to an edge of a multichip structure and looping the wiring back into a chip so that the exposed wiring at the edge may be open circuited upon etching the wiring.

Figure 13:
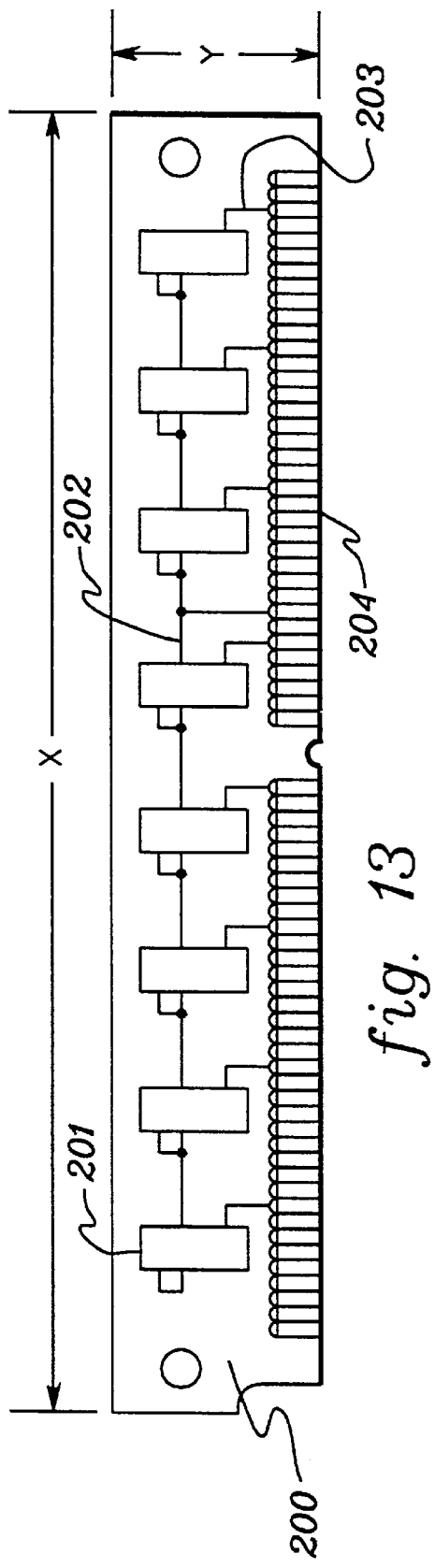
FIG. 13 depicts a single in-line memory module (SIMM) card with multiple memory modules.

The novel concepts presented herein have been discussed principally in connection with three-dimensional multichip structures; however, their applicability to single chip modules, e.g., mounted on packages such as printed circuit boards (PCBs), has been mentioned. FIG. 13 depicts a single in-line memory module (SIMM) package of 'X' by 'Y' dimensions, wherein 'X' may be 4.5 inches and 'Y' 0.6 inches. This PCB SIMM, denoted 200, includes external connector pins 204 and multiple memory modules 201 surface mounted on pads disposed on the depicted surface of PCB 200. By way of example, the pads electrically connect to single I/O wiring 203 and multiple parallel wirings such as the eight interconnected module input lines 202. PCB SIMM wire capacitance for short input/output (I/O) lines 203 is approximately 0.2C, while parallel connected lines 202 may be approximately 4C, wherein C comprises the input capacitance of a memory module (such as a 4 Mb or 16 Mb dynamic random access memory (DRAM)) which is approximately 4–5 picofarads (pf).

SIMM cards, which are fabricated for socket plug in to computer boards, are each driven by a memory controller present within the computer board. In designing such a card, there are two important considerations. First, the level of ESD protection when the SIMM is being handled, and second, the total capacitive loading presented by the SIMM pins to the controller, since this affects memory performance and power dissipation within the system. Generally, it would be desirable to maximize ESD protection during handling, while also minimizing capacitive loading after the SIMM has been attached to the computer board. Since the protect device typically produces ninety (90%) percent of the capacitive loading C, then the ability to disconnect chip protect devices after the SIMM has been inserted within a computer system is desirable.

By way of example, if module 201 comprises a conventional DRAM module, then the protect device would be permanently connected to the input/output circuit and the value of the capacitive loading at each terminal of the module is C. Thus, with a conventional DRAM module, the SIMM of FIG. 13 would have the following characteristics:

Unplugged ESD protection:
  Single chip I/O=4,000 volts
  Eight parallel chip I/O pins=32,000 volts.
Capacitance to circuit board when plugged in:
  Single chip I/O pin=1.2C
  (Module pin=C, & SIMM wiring=0.2C)
  Eight parallel chip I/O pins=12C
  (Module pin=8C; SIMM wiring=4C).

If module 201 is a specially designed module with I/O capable of being electronically deselected from connection to the protective device inside the module, then after insertion of the module into the board socket the capacitance presented to the circuit board would be:

Single chip I/O pin=0.3C
  (Module pin=0.1C; SIMM wiring=0.2C)
Eight parallel chip I/O pins=4.8C
  (Module pin=0.8C; SIMM wiring=4C).

Figure 14:
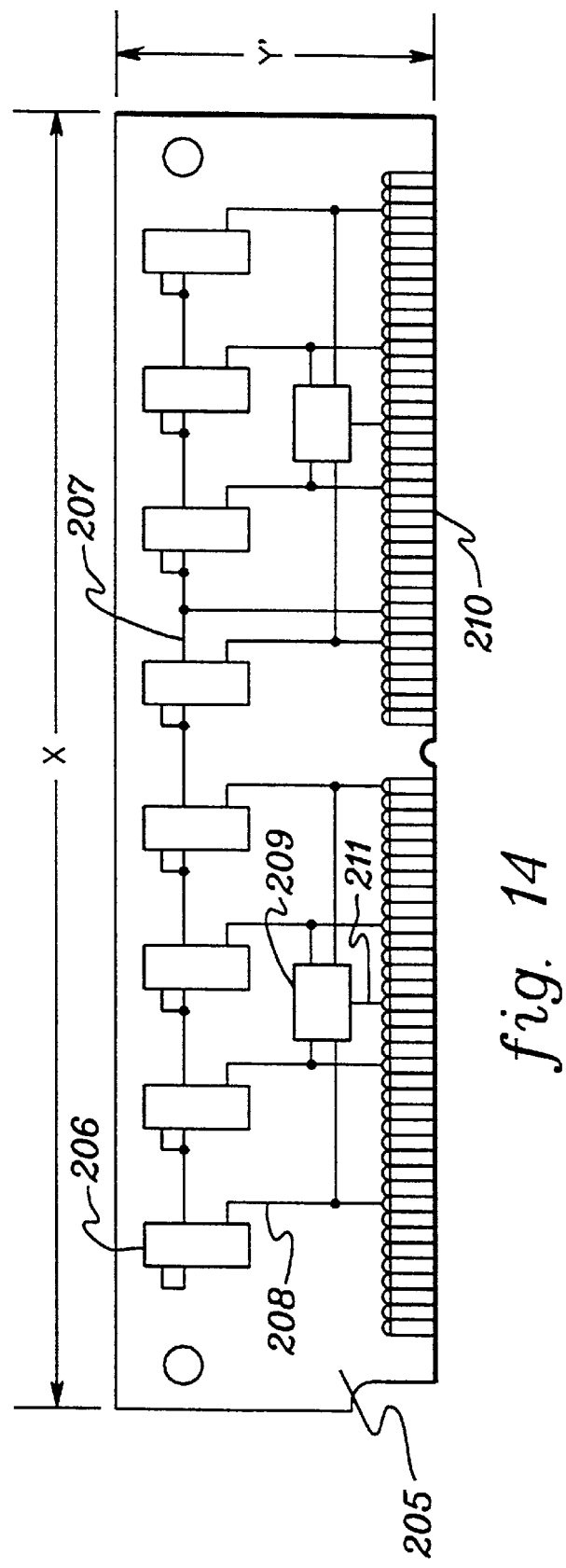
FIG. 14 depicts a SIMM card with multiple memory and application specific integrated circuit (ASIC) modules.

FIG. 14 depicts a SIMM composed of a printed circuit board 205, external connector pins 210, single chip memory modules 206, single chip I/O connections 208 and multiple module I/O connections 207. Additionally, an application specific integrated circuit (ASIC) module 209 is depicted. This module contains supplemental ESD protection that increases the total protection at each SIMM pin to a desired maximum value. This additional ESD protection is removed when the SIMM is plugged into the board. A control line 211 is provided for deactivation of the protect circuit. When disabled, the extra connection adds 0.1C for each module pin 209 and an additional 0.2C of SIMM wiring capacitance. Alternatively, the ASIC ESD protection could be de-activated internally by electronic means, triggered by a pattern or pattern timing sequence applied to ASIC module 209. This would eliminate the need for a control line 211.

If module 206 comprises a conventional DRAM with protective device permanently connected to the I/O pin, then each input has a capacitance C. The additional ASIC module 209 connects to each of the single inputs, increasing the ESD protection by a known voltage. Thus, single pin protection might be 32,000 volts for all SIMM pins, rather than a current SIMM protection level of 4,000 volts, When the SIMM is plugged into the system, the additional ESD protection is disconnected internal to module 209, pursuant to an electronic signal on input 211. The loading capacitance for this SIMM when plugged into the board would be:

Single chip I/O pin=1.5C
  (Module pin=C; ASIC module pin=0.1C; total SIMM wiring=0.4C)
Eight parallel chip I/O pins=12C;
  (Module pin=8C; SIMM wiring=4C).

If module 206 is a specially designed module with I/O capable of electronically deselecting an I/O connection to the protect device within the module, then after insertion of the module into the board socket the capacitance presented to the circuit board would be:

Single chip I/O pin=0.6C
  (Module pin=0.1C; ASIC module pin=0.1C; total SIMM wiring=0.4C)

Eight parallel chip I/O pins=4.8C (Module pin=0.8C; SIMM wiring=4C).

Thus, by employing specially designed DRAM modules and ASIC modules within the SIMM of FIG. 14, the minimum ESD protection level for the SIMM pins can be increased from 4,000 to 32,000 volts relative to the SIMM of FIG. 13 incorporating conventional DRAM modules. Further, the lead capacitance of a plugged in and powered SIMM is reduced. For a single chip I/O pin, the capacitance is reduced from 1.2C to 0.6C, while for an eight chip parallel I/O pin, the capacitance is reduced from 12C to 4.8C. The SIMM of FIG. 14, again applying the principals discussed herein, increased minimum SIMM pin level ESD protection by 8× and reduced pin loading capacitance by 2×, while also reducing leakage current through elimination of the protect device contribution. ASIC module 209 substantially increases ESD protection. Further, it can be designed to provide additional drive capability for the I/Os of modules 206, or other electrical functions.

To summarize, the concepts disclosed herein define semiconductor structures with numerous novel features and advantages over the existing art. First, through selective consolidation of redundant circuitry of a plurality of substantially identical chips into a single chip in a multichip stack, overall stack performance is improved since signal delay through redundant networks is eliminated. For example, output data from a dynamic random access memory (DRAM) chip in a DRAM stack must travel through two sets of off-chip drivers, one set on the DRAM chip itself, and another set on a logic endcap in communication with external stack circuitry. Elimination of the redundant DRAM chip off-chip driver can improve performance by as much as 2 nanoseconds. Further, unlike a conventional DRAM chip, operational functions and memory array configurations defined at a separate logic chip endcap can be readily converted to any specific application requirement by either redesigning the logic chip or replacing the logic chip with another design. Each memory array chip may principally comprise a memory array, array decoders, bit switches and sense amplifiers, which greatly enhances array utilization. With such complexity reduction, manufacturing and testing can also be simplified. Thus, universal three-dimensional memory array stacks can be created with synchronous operation, input/output width, power rating and other applications specific features defined at an interchangeable logic chip.

Another feature of the invention is the reduction or balancing of loading of I/O pads of a multichip structure. Since electrostatic discharge suppression circuitry can comprise up to ninety (90%) percent of capacitive loading on I/O pads, this concept centers on the elimination or redistribution of ESD circuitry within a multichip structure. However, any circuitry interfacing with an external device could be rebalanced at the multichip package level. The concept applies to bussed I/O pads, as well to single I/O pads. In application, only one ESD circuit may be required to protect all receivers electrically connected by a bussed I/O pad. This single circuit could be disposed in any of the interconnected chips or on a separate chip which interacts with external circuitry, for example, an endcap chip. Further, any number of techniques may be employed for open circuiting redundant electrostatic discharge circuitry.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method for fabricating a multichip semiconductor stack having input/output (I/O) nodes with customizable electrostatic discharge protection, said method comprising the steps of:
   (a) providing a plurality of semiconductor device chips, each semiconductor device chip comprising an integrated circuit connected to an I/O node and an electrostatic discharge suppression circuit designed to have an electrical connection to said I/O node;
   (b) laminating said plurality of integrated circuit chips such that a planar main surface of each semiconductor device chip is parallel and structurally coupled to a planar main surface of an adjacent semiconductor device chip of said plurality of semiconductor device chips, thereby defining a multichip stack having a side surface;
   (c) establishing a conductive pattern on said side surface of said multichip stack, said conductive pattern electrically connecting to each of the I/O nodes from the plurality of semiconductor device chips, at least some of said I/O nodes being electrically connected by said conductive pattern as a common I/O node; and
   (d) disrupting the electrical connection of at least one of said electrostatic discharge suppression circuits to a respective I/O node comprising part of said common I/O node.

2. The method of claim 1 wherein said disrupting step comprises turning off a switch, said switch interconnecting said at least one of said electrostatic discharge suppression circuits to a respective I/O node.

3. The method of claim 2 wherein said switch comprises a switch of low capacitive loading and low leakage current.

4. The method of claim 2 wherein said switch comprises a pass gate.

5. The method of claim 1 wherein said disrupting step comprises opening a fuse, said fuse interconnecting said at least one of said electrostatic discharge suppression circuits to a respective I/O node.

6. A method for fabricating a multichip semiconductor stack having input/output (I/O) nodes with customizable electrostatic discharge protection, said method comprising the steps of:
   (a) providing a plurality of semiconductor device chips, each semiconductor device chip comprising an integrated circuit connected to an I/O node and an electrostatic discharge suppression circuit designed to have an electrical connection to said I/O node;
   (b) laminating said plurality of integrated circuit chips such that a planar main surface of each semiconductor device chip is parallel and structurally coupled to a planar main surface of an adjacent semiconductor device chip of said plurality of semiconductor device chips, thereby defining a multichip stack having a side surface;
   (c) establishing a conductive pattern on said side surface of said multichip stack, said conductive pattern electrically connecting to each of the I/O nodes from the plurality of semiconductor device chips; and
   (d) modifying an electrical connection of at least one of said electrostatic discharge suppression circuits to at least one of said I/O nodes of said multichip stack.

7. The method of claim 6 wherein said modifying step is performed to customize electrostatic discharge suppression protection to said at least one of said I/O nodes.

8. The method of claim 7 wherein said modifying step comprises disrupting the electrical connection of said at least one of said electrostatic discharge suppression circuits to a respective I/O node in order to reduce electrostatic discharge protection to said respective I/O node.

9. The method of claim 7 wherein said modifying step comprises redirecting the electrical connection of said at least one of said electrostatic discharge suppression circuits in order to increase electrostatic discharge protection to said at least one I/O node.

10. The method of claim 6 wherein said modifying step serves to isolate at least one redundant electrostatic discharge suppression circuit from said I/O nodes.

11. The method of claim 6 wherein said modifying step serves to balance electrostatic discharge suppression circuitry loading on the I/O nodes of said multichip stack.

12. The method of claim 6 wherein said at least one of said I/O nodes comprises a common I/O node formed by electrically connecting with said conductive pattern at least some of said I/O nodes.

* * * * *